United States Patent
Yun

(10) Patent No.: US 9,336,838 B1
(45) Date of Patent: May 10, 2016

(54) SEMICONDUCTOR MEMORY APPARATUS AND SYSTEM INCLUDING THE SAME

(71) Applicant: SK hynix Inc., Icheon-si Gyeonggi-do (KR)

(72) Inventor: Dae Ho Yun, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/638,418

(22) Filed: Mar. 4, 2015

(30) Foreign Application Priority Data

Nov. 17, 2014 (KR) .................. 10-2014-0160074

(51) Int. Cl.
*G11C 7/00* (2006.01)
*G11C 7/10* (2006.01)

(52) U.S. Cl.
CPC .............. *G11C 7/1048* (2013.01); *G11C 7/106* (2013.01); *G11C 7/1078* (2013.01)

(58) Field of Classification Search
CPC ..... G11C 7/1048; G11C 7/106; G11C 7/1078
USPC ........................................ 365/189.05, 189.15
See application file for complete search history.

(56) References Cited

U.S. PATENT DOCUMENTS

| 6,160,742 A * | 12/2000 | Chung | ................. G11C 7/1051 365/189.05 |
| 7,830,728 B2 * | 11/2010 | Park | ......................... G11C 7/02 365/189.15 |
| 2008/0310240 A1 * | 12/2008 | Kim | ..................... G11C 7/1006 365/189.05 |

FOREIGN PATENT DOCUMENTS

KR 1020100053857 A 5/2010

* cited by examiner

*Primary Examiner* — Tan T. Nguyen
(74) *Attorney, Agent, or Firm* — William Park & Associates Ltd.

(57) ABSTRACT

A semiconductor memory apparatus includes a DBI calculation block, an inversion latch block, an inverted data selective output block, and a pipe latch block. The DBI calculation block performs a DBI calculation and outputs a DBI result signal based on a result of the DBI calculation. The inversion latch block inverts data and outputs the inverted data when a DBI enable signal is enabled. The inverted data selective output block outputs the inverted data as a data inversion signal in response to the DBI result signal and a pipe input signal. The pipe latch block receives the data, which is not inverted, and the inverted data, and outputs one of the data and the inverted data according to the result of the DBI calculation.

15 Claims, 4 Drawing Sheets

US 9,336,838 B1

SEMICONDUCTOR MEMORY APPARATUS AND SYSTEM INCLUDING THE SAME

CROSS-REFERENCES TO RELATED APPLICATION

The present application claims priority under 35 U.S.C. §119(a) to Korean application number 10-2014-0160074 filed on Nov. 17, 2014, in the Korean Intellectual Property Office, which is incorporated herein by reference in its entirety.

BACKGROUND

1. Technical Field

Embodiments of the present invention generally relate to an integrated circuit, and more particularly, in one or more embodiments, to a semiconductor memory apparatus and a system using the same.

2. Related Art

Efforts to reduce power consumption at a data bus have led to the adoption of data bus inversion ("DBI"). DBI may count the number of logic high levels (or logic low levels) among the data to be transmitted across a data bus and then decide if it would be advantageous in terms of power consumption to invert some or all of the bits prior to transmission.

For example, assuming that the transmission of low-level signal would consume more power than the transmission of high-level signal, if the number of low-level bits of data is larger than the number of high-level bits of data, it would be advantageous to transmit inverted data. A semiconductor memory apparatus or a system using DBI may also reduce power consumption when outputting data.

DBI requires a semiconductor memory apparatus or a system to calculate the number of low-level data bits and high-level data bits to determine whether to invert the data, and this may result in a delay.

SUMMARY

In an embodiment of the present invention, a semiconductor memory apparatus may include: an inversion latch block configured to invert and latch data and output latched data as inverted data, when a DBI enable signal is enabled; an inverted data selective output block configured to output the inverted data as a data inversion signal in response to a DBI result signal and a pipe input signal; and a pipe latch block configured to receive and latch the data and output latched data, in response to the pipe input signal, a pipe output signal and the data inversion signal.

In an embodiment of the present invention, a semiconductor memory apparatus may include: an inversion latch block configured to invert and latch data and output latched data as inverted data, in response to a first pipe input signal, a second pipe input signal and a DBI enable signal; an inverted data selective output block configured to output the inverted data as one of a first data inversion signal and a second data inversion signal in response to a DBI result signal, a first pipe input pulse, a second pipe input pulse and the DBI enable signal; a first pipe latch block configured to receive and latch the data in response to the first pipe input signal, invert or retain latched data in response to the first data inversion signal, and output latched data in response to a first pipe output signal; and a second pipe latch block configured to receive and latch the data in response to the second pipe input signal, invert or retain latched data in response to the second data inversion signal, and output latched data in response to a second pipe output signal.

DETAILED DESCRIPTION

Figure 1:
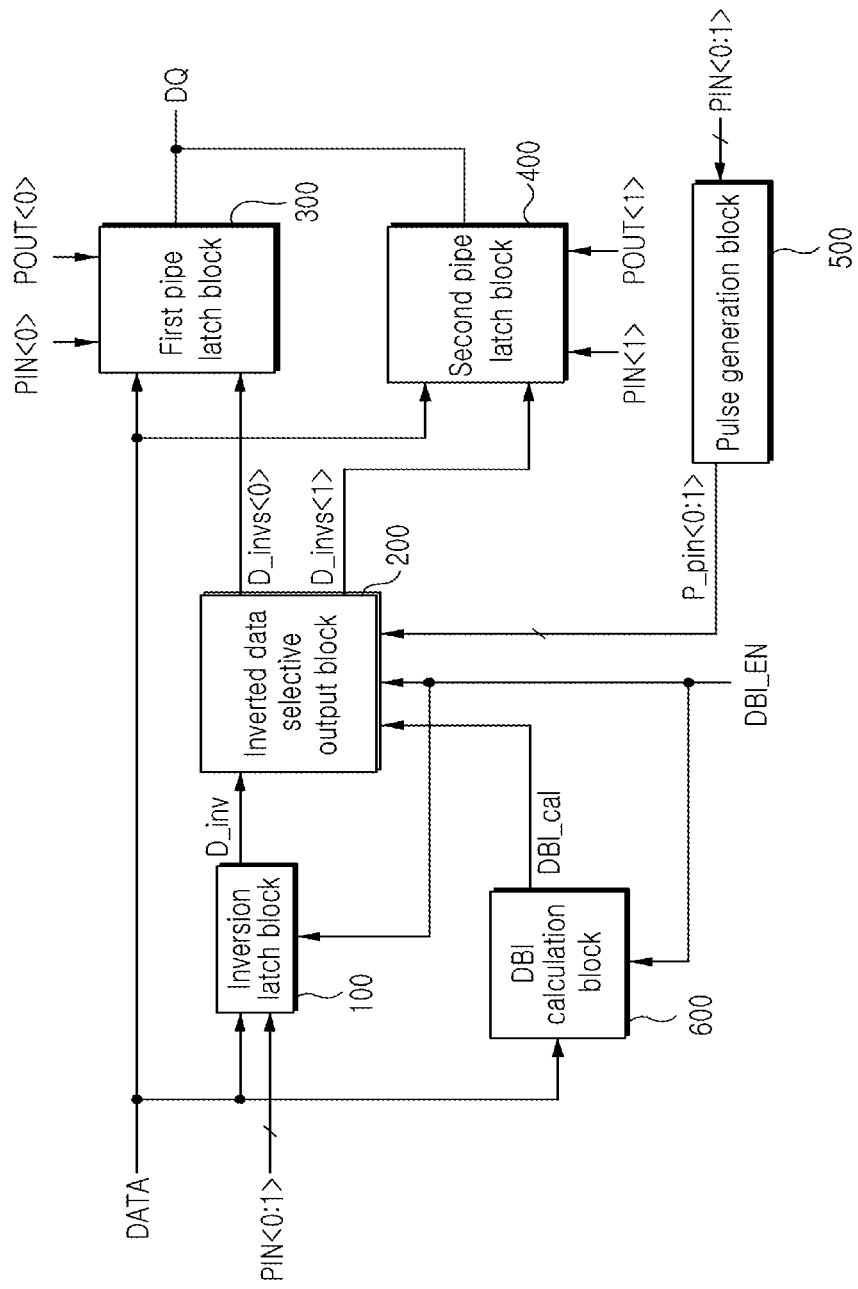
FIG. 1 is a configuration diagram illustrating an example of a semiconductor memory apparatus in accordance with an embodiment of the present invention.

FIG. 1 is a configuration diagram illustrating an example of a semiconductor memory apparatus in accordance with an embodiment of the present invention.

As shown in FIG. 1, a semiconductor memory apparatus in accordance with an embodiment of the present invention includes an inversion latch block 100, an inverted data selective output block 200, a first pipe latch block 300, a second pipe latch block 400, a pulse generation block 500, and a DBI calculation block 600.

The inversion latch block 100 may invert data DATA and output an inverted data D_inv. For example, the inversion latch block 100 may invert data DATA in response to a DBI enable signal DBI_EN, and output an inverted data D_inv according to first and second pipe input signals PIN<0> and PIN<1>. For example, when the first pipe input signal or second pipe input signal PIN<0> or PIN<1> is enabled, the inversion latch block 100 inverts the data DATA and stores the inverted data D_inv, and then outputs the inverted data D_inv in response to the DBI enable signal DBI_EN.

The inverted data selective output block 200 may generate first and second data inversion signals D_invs<0:1> by using the inverted data D_inv. For example, the inverted data selective output block 200 may output the inverted data D_inv as one of a first data inversion signal D_invs<0> and a second data inversion signal D_invs<1> in response to a DBI result signal DBI_cal, the DBI enable signal DBI_EN, and the first and second pipe input signals PIN<0:1>. For example, when the DBI enable signal DBI_EN, the DBI result signal DBI_cal are enabled, and one of the first and second pipe input signals PIN<0> and PIN<1> are disabled, the inverted data selective output block 200 may output the inverted data D_inv as one of the first and second data inversion signals D_invs<0> and D_invs<1>. When the DBI enable signal DBI_EN, the DBI result signal DBI_cal, and a first pipe input pulse P_pin<0> are enabled, the inverted data selective output block 200 may output the inverted data D_inv as the first data inversion signal D_invs<0>. When the DBI enable signal DBI_EN, the DBI result signal DBI_cal, and a second pipe input pulse P_pin<1> are enabled, the inverted data selective output block 200 may output the inverted data D_inv as the second data inversion signal D_invs<1>. The first pipe input pulse P_pin<0> is a pulse which is enabled when the first pipe input signal PIN<0> is disabled, and the second pipe input pulse P_pin<1> is a pulse which is enabled when the second pipe input signal PIN<1> is disabled.

The first pipe latch block 300 may receive and store the data DATA, and output the stored data in response to the first pipe input signal PIN<0>, a first pipe output signal POUT<0> and the first data inversion signal D_invs<0>. For example, the first pipe latch block 300 may receive and store the data DATA in response to the first pipe input signal PIN<0>, and output the stored data in response to the first pipe output signal POUT<0> and the first data inversion signal D_invs<0>. For example, the first pipe latch block 300 may store the data DATA when the first pipe input signal PIN<0> is enabled, invert the stored data or retain the stored data in response to the first data inversion signal D_invs<0>, and output the inverted or retained data when the first pipe output signal POUT<0> is enabled.

The second pipe latch block 400 may receive and store the data DATA, and output the stored data in response to the second pipe input signal PIN<1>, a second pipe output signal POUT<1> and the second data inversion signal D_invs<1>. For example, the second pipe latch block 400 may receive and store the data DATA in response to the second pipe input signal PIN<1>, and output the stored data in response to the second pipe output signal POUT<1> and the second data inversion signal D_invs<1>. For example, the second pipe latch block 400 may store the data DATA when the second pipe input signal PIN<1> is enabled, invert the stored data or retain the latched data in response to the second data inversion signal D_invs<1>, and output the inverted or retained data when the second pipe output signal POUT<1> is enabled.

The pulse generation block 500 may generate the first and second pipe input pulses P_pin<0> and P_pin<1> in response to the first and second pipe input signals PIN<0> and PIN<1>. For example, the pulse generation block 500 may generate the first and second pipe input pulses P_pin<0> and P_pin<1> which are enabled when the first and second pipe input signals PIN<0> and PIN<1> are disabled. For example, the pulse generation block 500 may generate the first pipe input pulse P_pin<0> which is enabled when the first pipe input signal PIN<0> is disabled. The pulse generation block 500 may generate the second pipe input pulse P_pin<1> which is enabled when the second pipe input signal PIN<1> is disabled.

The DBI calculation block 600 may perform a DBI calculation in response to the data DATA when the DBI enable signal DBI_EN is enabled, and output a result thereof as the DBI result signal DBI_cal.

Figure 2:
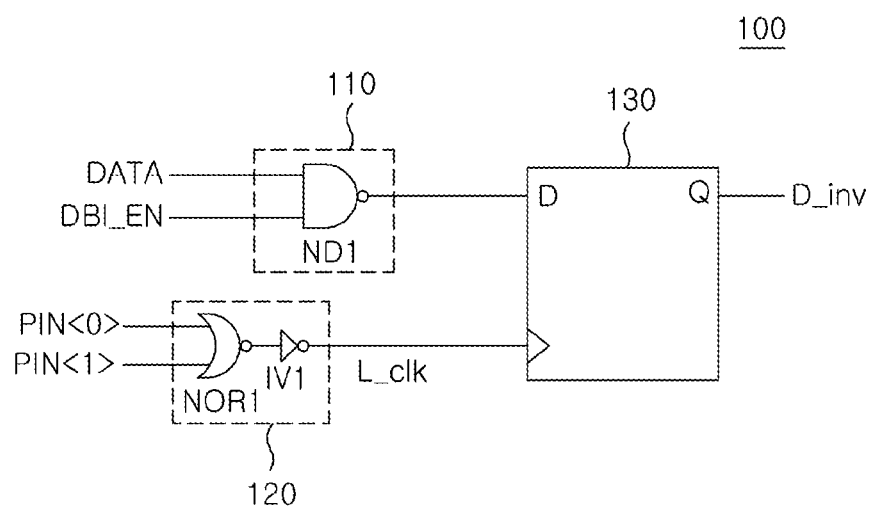
FIG. 2 is a configuration diagram illustrating an example of the inversion latch block shown in FIG. 1.

As shown in FIG. 2, the inversion latch block 100 may include a data inversion unit 110, a latch clock generation unit 120, and a data storage unit 130.

The data inversion unit 110 may invert the data DATA when the DBI enable signal DBI_EN is enabled.

The data inversion unit 110 may include a first NAND gate ND1 which receives the DBI enable signal DBI_EN and the data DATA.

The latch clock generation unit 120 may generate a latch clock L_clk which is enabled when any one of the first and second pipe input signals PIN<0> and PIN<1> is enabled. For example, the latch clock generation unit 120 may enable the latch clock L_clk when the first pipe input signal PIN<0> is enabled, or when the second pipe input signal PIN<1> is enabled.

The latch clock generation unit 120 may include a first NOR gate NOR1, and a first inverter IV1. The first NOR gate NOR1 may receive the first and second pipe input signals PIN<0> and PIN<1>. The first inverter IV1 may receive the output of the first NOR gate NOR1, and output the latch clock L_clk.

The data storage unit 130 may receive and store an output signal of the data inversion unit 110 when the latch clock L_clk is enabled, and output the stored signal as the inverted data D_inv. The data storage unit 130 may include a flip-flop.

Figure 3:
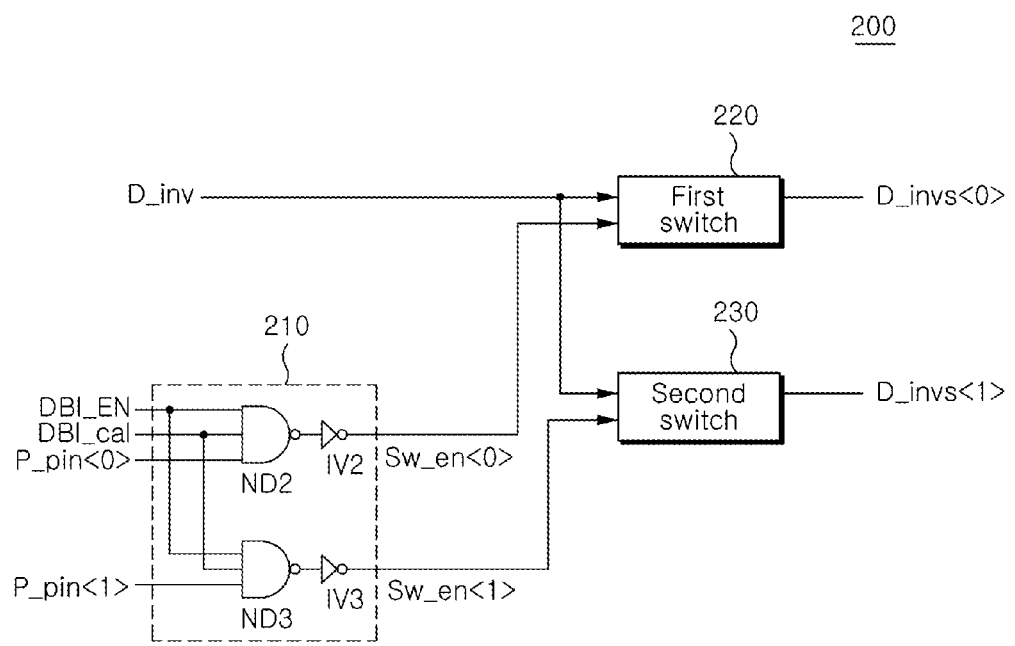
FIG. 3 is a configuration diagram illustrating an example of the inverted data selective output block shown in FIG. 1.

As shown in FIG. 3, the inverted data selective output block 200 may include a switch control unit 210, and first and second switches 220 and 230.

The switch control unit 210 may enable one of a first switch enable signal Sw_en<0> and a second switch enable signal Sw_en<1> in response to the DBI result signal DBI_cal, when the DBI enable signal DBI_EN is enabled and one of the first and second pipe input signals PIN<0> and PIN<1> is disabled. In an embodiment of the present invention, the first pipe input pulse P_pin<0> may be enabled when the first pipe input signal PIN<0> is disabled, and the second pipe input pulse P_pin<1> may be enabled when the second pipe input signal PIN<1> is disabled. For example, the switch control unit 210 may generate the first switch enable signal Sw_en<0> in response to the DBI result signal DBI_cal when the DBI enable signal DBI_EN is enabled and the first pipe input signal PIN<0> is disabled (e.g., the first pipe input pulse P_pin<0> is enabled). The switch control unit 210 may generate the second switch enable signal Sw_en<1> in response to the DBI result signal DBI_cal when the DBI enable signal DBI_EN is enabled and the second pipe input signal PIN<1> is disabled (e.g., the second pipe input pulse P_pin<1> is enabled). The switch control unit 210 may enable the first switch enable signal Sw_en<0> when the DBI enable signal DBI_EN is enabled, the first pipe input pulse P_pin<0> is enabled, and the DBI result signal DBI_cal is enabled. The switch control unit 210 may enable the second switch enable signal Sw_en<1> when the DBI enable signal DBI_EN is enabled, the second pipe input pulse P_pin<1> is enabled, and the DBI result signal DBI_cal is enabled. The switch control unit 210 may disable the first switch enable signal Sw_en<0> when at least one of the DBI enable signal DBI_EN, the first pipe input pulse P_pin<0> and the DBI result signal DBI_cal is disabled. The switch control unit 210 may disable the second switch enable signal Sw_en<1> when at least one of the DBI enable signal DBI_EN, the second pipe input pulse P_pin<1> and the DBI result signal DBI_cal is disabled.

The switch control unit 210 may include second and third NAND gates ND2 and ND3, and second and third inverters IV2 and IV3. The second NAND gate ND2 may receive the DBI enable signal DBI_EN, the DBI result signal DBI_cal, and the first pipe input pulse P_pin<0>. The third NAND gate ND3 may receive the DBI enable signal DBI_EN, the DBI result signal DBI_cal, and the second pipe input pulse P_pin<1>. The second inverter IV2 may receive an output signal of the second NAND gate ND2, and output the first switch enable signal Sw_en<0>. The third inverter IV3 may receive an output signal of the third NAND gate ND3, and output the second switch enable signal Sw_en<1>.

The first switch 220 may output the inverted data D_inv as the first data inversion signal D_invs<0> when the first switch enable signal Sw_en<0> is enabled.

The second switch 230 may output the inverted data D_inv as the second data inversion signal D_invs<1> when the second switch enable signal Sw_en<1> is enabled.

The configurations of the first pipe latch block 300 and the second pipe latch block 400 are the same except that signals inputted thereto and outputted therefrom are different. Therefore, the description of the configuration of the first pipe latch block 300 may also apply to the second pipe latch block 400.

Figure 4:
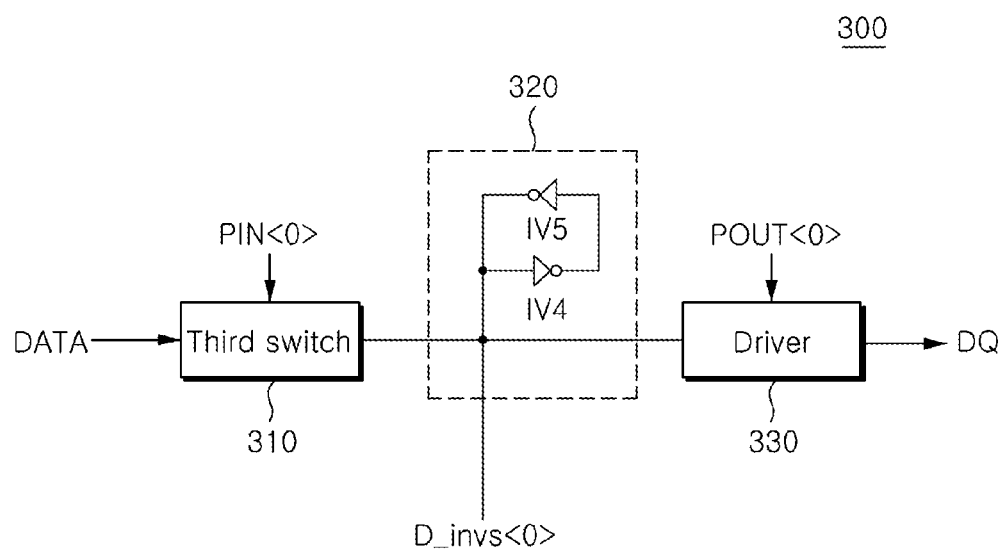
FIG. 4 is a configuration diagram illustrating an example of the first pipe latch block shown in FIG. 1.

As shown in FIG. 4, the first pipe latch block 300 may include a third switch 310, a latch unit 320, and a driver 330.

The third switch 310 may receive the data DATA and transfer the data DATA to the latch unit 320, when the first pipe input signal PIN<0> is enabled.

The latch unit 320 may store the data DATA transferred from the third switch 310, and invert or retain the stored data in response to the first data inversion signal D_invs<0>. For example, if the first data inversion signal D_invs<0> is a low level when the latch unit 320 stores high level data, the latch unit 320 may invert the high level and store low level data.

The driver 330 may amplify and/or transfer the data stored in the latch unit 320, and output output data DQ, when the first pipe output signal POUT<0> is enabled.

Operations of the semiconductor memory apparatus in accordance with the embodiment of the present invention will be described below.

When DBI is not performed, the DBI enable signal DBI_EN is disabled.

Referring to FIG. 1, if the DBI enable signal DBI_EN is disabled, the inversion latch block 100, the inverted data selective output block 200, and the DBI calculation block 600 are all deactivated.

If the DBI enable signal DBI_EN is disabled, the inversion latch block 100 does not store the data DATA, the inverted data selective output block 200 does not generate the first and second data inversion signals D_invs<0> and D_invs<1>, and the DBI calculation block 600 does not perform DBI calculation.

The first pipe latch block 300 may store the data DATA when the first pipe input signal PIN<0> is enabled, and output the stored data when the first pipe output signal POUT<0> is enabled.

Also, the second pipe latch block 400 may store the data DATA when the second pipe input signal PIN<1> is enabled, and output the stored data when the second pipe output signal POUT<1> is enabled.

When DBI is performed, the DBI enable signal DBI_EN is enabled.

Referring to FIG. 1, if the DBI enable signal DBI_EN is enabled, the inversion latch block 100, the inverted data selective output block 200, and the DBI calculation block 600 are activated.

If the first pipe input signal PIN<0> is enabled, the first pipe latch block 300 may receive and store the data DATA.

If the first pipe input signal PIN<0> is enabled while the DBI enable signal DBI_EN is enabled, the inversion latch block 100 may invert the data DATA and output an inverted data D_inv. For example, if the first pipe input signal PIN<0> is enabled, the inversion latch block 100 may store inverted data of the data DATA. Here, the data DATA may be the same as the data stored in the first pipe latch block 300.

The DBI calculation block 600 may perform a DBI calculation (e.g., comparison between the numbers of low-level bits and high-level bits of data) in response to the data DATA, and output a result of the DBI calculation as the DBI result signal DBI_cal.

The pulse generation block 500 may generate the first pipe input pulse P_pin<0> which is enabled when the first input signal PIN<0> is disabled.

The inverted data selective output block 200 may output the inverted data D_inv as the first data inversion signal D_invs<0> in response to the DBI result signal DBI_cal and the first pipe input pulse P_pin<0>. The inverted data selective output block 200 may output the inverted data D_inv as the first data inversion signal D_invs<0> when the first pipe input pulse P_pin<0 and the DBI result signal DBI_cal are enabled while the DBI enable signal DBI_EN is enabled. The DBI result signal DBI_cal may be enabled when it is expected that transmitting inverted data, which is to be stored in the first pipe latch block 300, would reduce power consumption.

Whether to enable the DBI result signal DBI_cal may be determined based on comparison between the numbers of low-level bits and high-level bits of data.

The first pipe latch block 300, which stores the data DATA when the first pipe input signal PIN<0> is enabled, may invert the stored data when the first data inversion signal D_invs<0> is inputted.

The first pipe latch block 300 may output the stored data or the inverted data when the first pipe output signal POUT<0> is enabled.

If the second pipe input signal PIN<1> is enabled, the second pipe latch block 400 may receive and store the data DATA.

If the second pipe input signal PIN<1> is enabled, the inversion latch block 100 may invert the data DATA. If the second pipe input signal PIN<1> is enabled, the inversion latch block 100 may store inverted data of the data DATA, which is to be stored in the second pipe latch block 400.

The DBI calculation block 600 may perform DBI calculation in response to the data DATA, and output a result thereof as the DBI result signal DBI_cal.

The pulse generation block 500 may generate the second pipe input pulse P_pin<1> which is enabled when the second pipe input signal PIN<1> is disabled.

The inverted data selective output block 200 may output the inverted data D_inv as the second data inversion signal D_invs<1> in response to the DBI result signal DBI_cal and the second pipe input pulse P_pin<1>. The inverted data selective output block 200 may output the inverted data D_inv as the second data inversion signal D_invs<1> when the second pipe input pulse P_pin<1> and the DBI result signal DBI_cal are enabled while the DBI enable signal DBI_EN is enabled. The DBI result signal DBI_cal may be enabled when it is expected that transmitting inverted data, which is to be stored in the second pipe latch block 400, would reduce power consumption.

The second pipe latch block 400, which stores the data DATA when the second pipe input signal PIN<1> is enabled, may invert the stored data when the second data inversion signal D_invs<1> is inputted.

The second pipe latch block 400 may output the stored data or the inverted data when the second pipe output signal POUT<1> is enabled.

The first and second pipe latch blocks 300 and 400 may receive the data DATA, which is not inverted, and data inversion signals D_invs<0:1>, which is inverted from the data DATA, and output one of the data DATA and the data inversion signals D_invs<0:1> according to the result of the DBI calculation.

In a semiconductor memory apparatus or a system in accordance with an embodiment of the present invention, when a pipe input signal is enabled, a pipe latch block may store data and at the same time an inversion latch block may invert the data and store the inverted data. Also, when the pipe input signal is disabled, whether to invert or retain the data stored in the pipe latch block is determined by inputting or not inputting the inverted data, which are stored in the inversion latch block, to the pipe latch block according to a DBI result signal, which is generated based on comparison between the numbers of low-level bits and high-level bits of data. In an embodiment of the present invention, whether to retain or invert the data stored in the pipe latch block may be determined according to a DBI result, which may be determined during one cycle of the pipe input signal through which the pipe input signal is enabled and disabled. Therefore, a delay due to DBI calculation may be reduced. In addition, a semiconductor memory apparatus or a system may use DBI without a delay circuit to delay data input during DBI calculation. Moreover, since a delay circuit is not used, errors, which may be caused by variation in delay time due to a variation in process, voltage and temperature ("PVT"), may decrease.

While various embodiments have been described above, it will be understood to those skilled in the art that the embodiments described are by way of example only. Accordingly, the semiconductor memory apparatus and system described herein should not be limited based on the described embodiments.

What is claimed is:

1. A semiconductor memory apparatus comprising:
a data bus inversion DBI calculation block configured to perform a DBI calculation and output a data bus inversion DBI result signal based on a result of the DBI calculation;
an inversion latch block configured to invert data and output the inverted data when a data bus inversion DBI enable signal is enabled;
an inverted data selective output block configured to output the inverted data as a data inversion signal in response to the DBI result signal and a pipe input signal; and
a pipe latch block configured to receive the data, which is not inverted, and the inverted data, and output one of the data and the inverted data according to the result of the DBI calculation.

2. The semiconductor memory apparatus according to claim 1, wherein the inversion latch block inverts the data and outputs inverted data when the pipe input signal and the DBI enable signal are enabled.

3. The semiconductor memory apparatus according to claim 2, wherein the inversion latch block comprises:
a data inversion unit configured to invert the data when the DBI enable signal is enabled;
a latch clock generation unit configured to generate a latch clock which is enabled when the pipe input signal is enabled; and
a data storage unit configured to receive and store an output signal of the data inversion unit and output the stored signal as the inverted data when the latch clock is enabled.

4. The semiconductor memory apparatus according to claim 1, wherein the inverted data selective output block outputs the inverted data as the data inversion signal in response to the DBI result signal when the DBI enable signal is enabled and the pipe input signal is disabled.

5. The semiconductor memory apparatus according to claim 4, wherein the inverted data selective output block comprises:
a switch control unit configured to generate a switch enable signal in response to the DBI result signal when the DBI enable signal is enabled and the pipe input signal is disabled; and
a switch configured to output the inverted data as the data inversion signal when the switch enable signal is enabled.

6. The semiconductor memory apparatus according to claim 1, wherein the pipe latch block receives and stores the data when the pipe input signal is enabled, inverts the stored data or retains the stored data in response to the data inversion signal, and outputs the inverted or retained data when a pipe output signal is enabled.

7. The semiconductor memory apparatus according to claim 6, wherein the pipe latch block comprises:
a switch configured to receive the data when the pipe input signal is enabled;
a latch unit configured to store an output signal of the switch, and invert or retain the stored data in response to the data inversion signal; and
a driver configured to amplify and output an output signal of the latch unit in response to the pipe output signal.

8. A semiconductor memory apparatus comprising:
a data bus inversion DBI calculation block configured to perform a DBI calculation and output a data bus inversion DBI result signal based on a result of the DBI calculation;
is an inversion latch block configured to invert data and output the inverted data in response to a first pipe input signal, a second pipe input signal and a data bus inversion DBI enable signal;
an inverted data selective output block configured to output the inverted data as one of a first data inversion signal and a second data inversion signal in response to the DBI result signal, a first pipe input pulse, a second pipe input pulse and the DBI enable signal;
a first pipe latch block configured to receive and store the data in response to the first pipe input signal, invert or retain the stored data in response to the first data inversion signal, and output the inverted or retained data in response to a first pipe output signal; and
a second pipe latch block configured to receive and store the data in response to the second pipe input signal, invert or retain the stored data in response to the second data inversion signal, and output the inverted or retained data in response to a second pipe output signal.

9. The semiconductor memory apparatus according to claim 8, further comprising:
a pulse generation block configured to generate the first pipe input pulse which is enabled when the first pipe input signal is disabled, and generate the second pipe input pulse which is enabled when the second pipe input signal is disabled.

10. The semiconductor memory apparatus according to claim 9,
wherein the inverted data selective output block outputs the inverted data as the first data inversion signal in response to the DBI result signal when the DBI enable signal and the first pipe input pulse are enabled, and
wherein the inverted data selective output block outputs the inverted data as the second data inversion signal in response to the DBI result signal when the DBI enable signal and the second pipe input pulse are enabled.

11. The semiconductor memory apparatus according to claim 10, wherein the inverted data selective output block comprises:
a switch control unit configured to generate a first switch enable signal in response to the DBI result signal when the DBI enable signal and the first pipe input pulse are enabled, and generate a second switch enable signal in response to the DBI result signal when the DBI enable signal and the second pipe input pulse are enabled;
a first switch configured to output the inverted data as the first data inversion signal when the first switch enable signal is enabled; and
a second switch configured to output the inverted data as the second data inversion signal when the second switch enable signal is enabled.

12. The semiconductor memory apparatus according to claim 8, wherein the DBI calculation block performs the DBI calculation in response to the data when the DBI enable signal is enabled.

13. The semiconductor memory apparatus according to claim 8, wherein the inversion latch block inverts the data and outputs inverted data when one of the first pipe input signal and the second pipe input signal is enabled while the DBI enable signal is enabled.

14. The semiconductor memory apparatus according to claim 13 wherein the inversion latch block comprises:
   a data inversion unit configured to invert the data when the DBI enable signal is enabled;
   a latch clock generation unit configured to generate a latch clock which is enabled when one of the first and second pipe input signals is enabled; and
   a data storage unit configured to receive and store an output signal of the data inversion unit and output the stored signal as the inverted data when the latch clock is enabled.

15. The semiconductor memory apparatus according to claim 8, wherein each of the first and second pipe latch blocks comprises:
   a switch configured to receive the data when each of the first and second pipe input signals is enabled;
   a latch unit configured to store an output signal of the switch, and invert or retain the stored data in response to each of the first and second data inversion signals; and
   a driver configured to amplify and output an output signal of the latch unit in response to each of the first and second pipe output signals.

* * * * *